United States Patent [19]

Lee et al.

[11] Patent Number: 5,781,041
[45] Date of Patent: Jul. 14, 1998

[54] SENSE AMPLIFIER WITH LOW POWER IN A SEMICONDUCTOR DEVICE

[75] Inventors: Jong Hyeop Lee; Yong Chul Cho, both of Kyoungkido, Rep. of Korea

[73] Assignee: Hyundai Electronics Industries Co., Ltd., Rep. of Korea

[21] Appl. No.: 669,746

[22] Filed: Jun. 26, 1996

[30]   Foreign Application Priority Data

Jun. 28, 1995 [KR] Rep. of Korea .................. 1995-17887

[51] Int. Cl.[6] .................................................. G01R 19/00
[52] U.S. Cl. ............................................. 327/51; 327/55
[58] Field of Search .................... 327/51–57; 365/189.21

[56]   References Cited

U.S. PATENT DOCUMENTS 4,644,196  2/1987  Flannagen ........................ 327/53
5,015,891  5/1991  Choi .................................. 307/530
5,281,873  1/1994  Seki ................................... 327/51
5,473,567  12/1995  McClure ............................ 327/51
5,568,073  10/1996  McClure ............................ 327/51

Primary Examiner—Toan Tran
Attorney, Agent, or Firm—Blakely Sokoloff Taylor & Zafman

[57]   ABSTRACT

The present invention provides a sense amplifier in a semiconductor device, comprising a detector for enabling the sense amplifier in response to the output thereof and disabling the sense amplifier in response to the increase of the output thereof, whereby the detecting means disables the sense amplifier when the output voltage from the sense amplifier increases up to a predetermined voltage level. The sense amplifier prevent data error from being generated and decrease power consumption by using the outputs thereof when the outputs thereof increases to a constant level.

6 Claims, 2 Drawing Sheets

5,781,041

SENSE AMPLIFIER WITH LOW POWER IN A SEMICONDUCTOR DEVICE

BACKGROUND OF THE INVENTION

1. Field of the Invention

The present invention relates to a sense amplifier capable of decreasing power by controlling the sensing operation using the outputs thereof.

2. Description of Prior Art

First, FIG. 1 is a schematic view showing a conventional sense amplifier used in memory devices.

As shown in FIG. 1 the sense amplifier consists of PMOS transistors 1 and 3, and NMOS transistors 2, 4 and 5. Inputs from the first and second bit lines (BL and /BL(low in active state)) are respectively applied to the gate of the PMOS transistors 1 and 3. Also, the NMOS transistors 2 and 4, which are respectively coupled to the PMOS transistors 1 and 3 in series, are couple to the NMOS transistors 5 whose gate receives an enable signal. The gate of the NMOS transistor 2 is connected to the drain of the PMOS transistor 3 and the gate of the NMOS transistor 4 is connected to the drain of the PMOS transistor 1. The output terminals SAout and /SAout are formed in the connecting point between the PMOS transistors 1 and 3 and the NMOS transistors 2 and 4, respectively.

The NMOS transistor 5, of which source is connected to ground level, controls the operation of the amplifier according to the enable signal (SAE) from another logic circuit.

Since a sufficient timing margin must be secured to operate the sense amplifier with safety, the sense amplifier must be in the enable state for a while after going through a sensing operation.

Accordingly, power consumption occurs because of the enable state of the sense amplifier after going through a sensing operation. Furthermore, this can generate an error in the sensing operation.

SUMMARY OF THE INVENTION

Therefore, it is an object of the present invention to provide a sense amplifier capable of disabling itself, in order to prevent data error from being generated and decrease power consumption, using the outputs thereof when the outputs thereof increase to a constant level.

In accordance with the present invention, there is provided a detecting means for enabling the sense amplifier in response to the output thereof and disabling the sense amplifier in response to the increase of the output thereof, whereby the detecting means disables the sense amplifier when the output voltage from the sense amplifier increases up to a predetermined voltage level.

BRIEF DESCRIPTION OF THE DRAWINGS

Other objects and aspects of the invention will become apparent from the following description of embodiments with reference to the accompanying drawings, in which.

DETAILED DESCRIPTION OF THE INVENTION

Hereinafter, a sense amplifier according to the present invention will be described below referring to FIG. 2.

Figure 1:
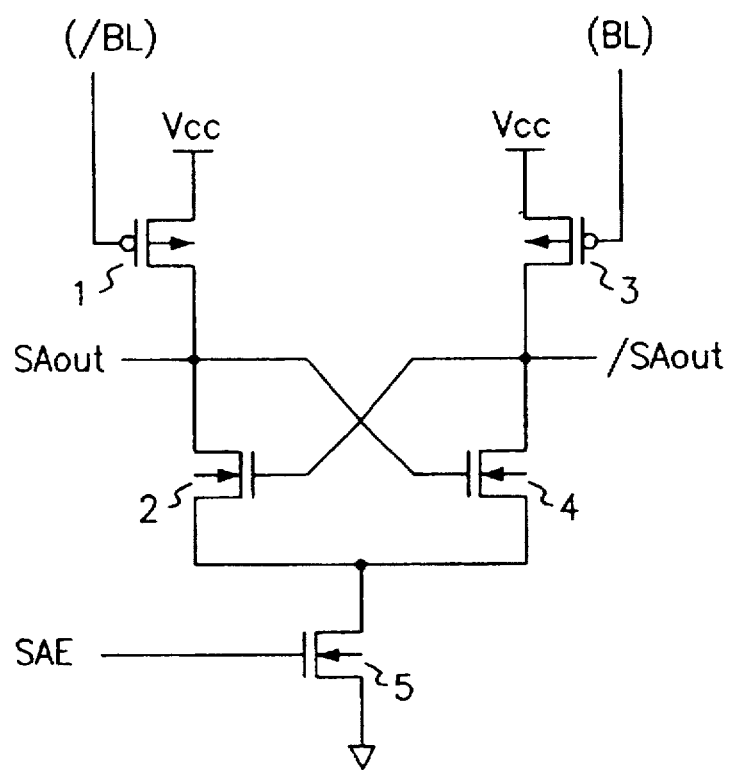
FIG. 1 is a schematic view illustrating a conventional sense amplifier.
Figure 2:
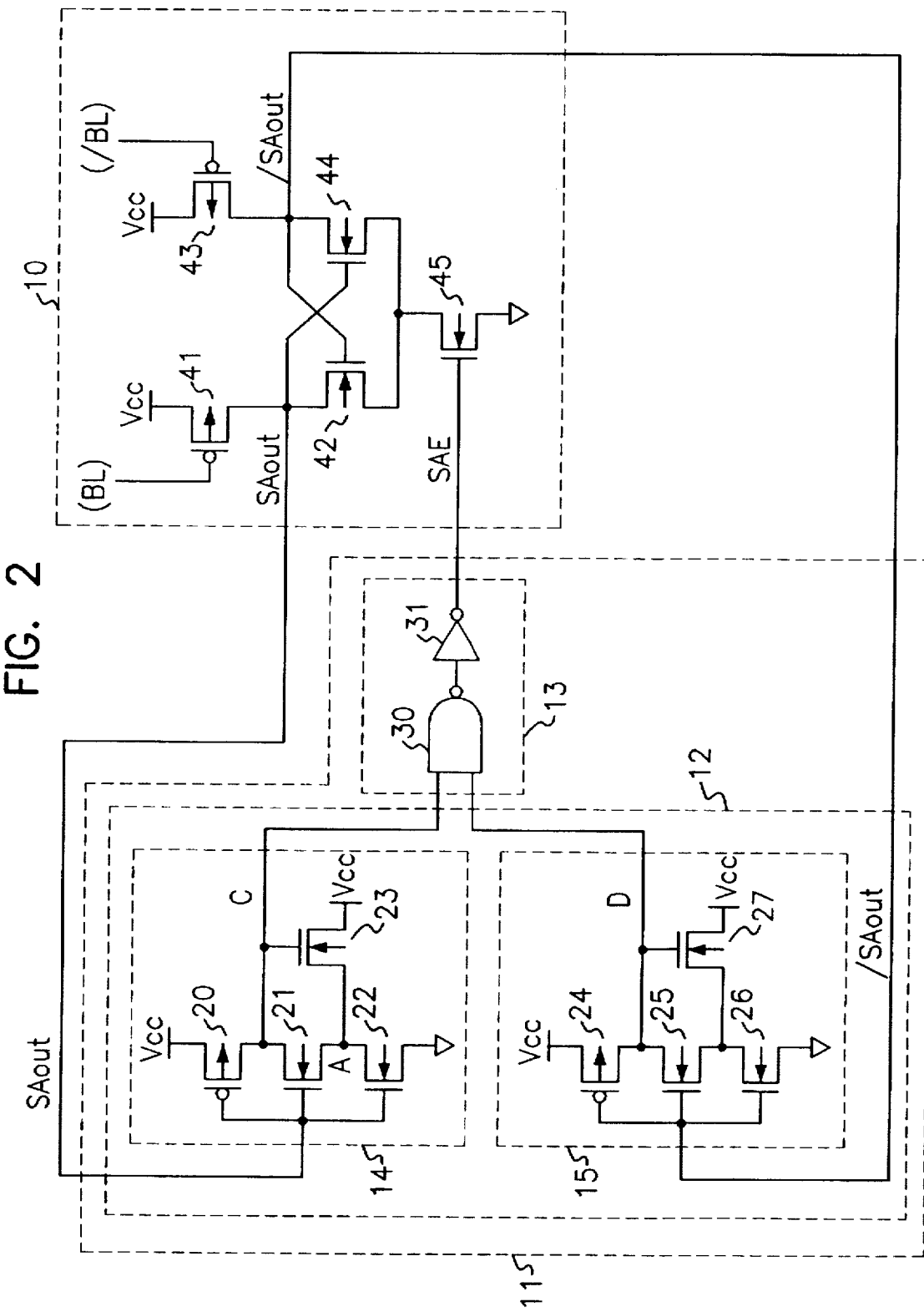
FIG. 2 is a schematic view illustrating a sense amplifier according to the present invention.

As shown in FIG. 2, the sense amplifier according to the present invention includes a sensing end detector 11 together with the conventional sense amplifier 10.

The sense amplifier 10 is composed of two PMOS transistors 41 and 43, and three NMOS transistor 42, 44 and 45 as illustrated in FIG. 2.

The sense end detector 11 detects a point of time when the sensing operation of the sense amplifier 10 must be ended in accordance with sensing output signals SAout and /SAout from the sense amplifier outputting an enable or a disable signal to the gate of the NMOS transistor 45 in the sense amplifier 10. The sensing end detector 11 consists of a voltage level detector 12 and an enable/disable part 13. The voltage level detector 12 consists of a first voltage level detector 14 and a second voltage level detector 15 which detect the sensing output signals SAout or /SAout increasing to a constant voltage level.

The first voltage level detector 14 consists of one PMOS transistor 20 and three NMOS transistors 21, 22 and 23. The PMOS transistor 20 acts as a pull-up transistor, and the NMOS transistors 21 and 22 act as pull-down transistors. The PMOS transistor 20 has the source coupled to a voltage supply Vcc and the gate receiving the sensing output signal SAout. The NMOS transistor 21 has the gate receiving the sensing output signal SAout and the drain coupled to the drain of the PMOS transistor 20. The NMOS transistor 22 has the gate receiving the sensing output signal SAout, the drain coupled to the source of the NMOS transistor 21, and the source coupled to a ground level. The NMOS transistor 23 has a drain coupled to a voltage supply Vcc, the gate coupled to the connecting point between the drain of the PMOS transistor 20 and the drain of the NMOS transistor 21, and the source coupled to the connecting point between the source of the NMOS transistor 21 and the drain of the NMOS transistor 22.

Also, the second voltage level detector 15 consists of one PMOS transistor 24 and three NMOS transistors 25, 26 and 27. The PMOS transistor 24 acts as a pull-up transistor, and the NMOS transistors 25 and 26 act as pull-down transistors. The PMOS transistor 24 has the source coupled to a voltage supply Vcc and the gate receiving the sensing output signal /SAout. The NMOS transistor 25 has the gate receiving the sensing output signal /SAout and the drain coupled to the drain of the PMOS transistor 24. The NMOS transistor 26 has the gate receiving the sensing output signa /SAout, the drain coupled to the source of the NMOS transistor 25, and the source coupled to a ground level. The NMOS transistor 27 has a drain coupled to a voltage supply Vcc, the gate coupled to the connecting point between the drain of the PMOS transistor 24 and the drain of the NMOS transistor 25, and the source coupled to the connecting point between the source of the NMOS transistor 25 and the drain of the NMOS transistor 26.

The enable/disable part 13 ANDing the outputs from the voltage level detector 12 consists of a NAND gate 30 and an inverter 31 to output the enable or the disable signal to the gate of the NMOS transistor 45 in the sense amplifier 10.

In case where the sensing output signal SAout is at a low level, the PMOS transistor 20 in the first voltage level detector 14 is turned on and the output (at node C) of the first voltage level detector 14 is at a high level so that the NMOS transistor 23 is turned on. At this time, because the NMOS transistors 21 and 22 are turned off, the potential at node A is Vcc-Vth.

Also, in case where the voltage level from the sense amplifier 10 is increasing up to Vtn, the NMOS transistor 22 is turned on, but the NMOS transistor 21 is still turned off because the potential at node A is Vcc-Vtn.

However, if the voltage of the sensing output signal SAout continuously increases with the sensing operation of the sense amplifier 10, the output from the first voltage level detector 14 decreases and the NMOS transistor 23 is turned off, so that the potential at node A decreases.

If the potential at node A decreases, the NMOS transistor 21 is turned on so that the pull-down operation caused by the NMOS transistors 21 and 22 is performed at a high speed.

This pull-down operation is similar to an inverter using the CMOS technology. In other words, when the output from the sense amplifier 10 with the amplification thereof increases more than a reference voltage, the first voltage level detector 14 which outputs a low level signal to the enable/disable part 13. This output voltage level transition is achieved by controlling the length and width of the NMOS transistors 21 and 23.

Likewise, the second voltage level detector 15 performs the same detecting operation as the first voltage level detector 14 according to the inverted sensing output signal /SAout.

As a result, when the sensing output signal SAout from the sense amplifier 10 is less than a reference voltage which is determined by the length and width of the NMOS transistors 21 and 23, the first voltage level detector 14 outputs a high level voltage to the enable/disable part 13 at node C. Similarly, when the sensing output signal /SAout from the sense amplifier 10 is less than a reference voltage which is determined by the length and width of the NMOS transistors 25 and 27, the second voltage level detector 15 outputs a high level voltage to the enable/disable part 13 at node D.

The outputs from the first and second voltage level detectors 14 and 15 are input into the NAND gate 30 of the enable/disable part 13 and the output from the NAND gate 30 is inverted by the inverter 31 whose output terminal is couple to the gate of the NMOS transistor 45. Accordingly, if the outputs from the first and second voltage level detectors 14 and 15 are all high level outputs, the sense amplifier 10 is still in the enable state, allowing the sense amplifier 10 to continuously sense data stored in the memory cell through bit lines.

On the other hand, when the sensing output signal SAout from the sense amplifier 10 is more than the reference voltage according to the continued sensing operation, the PMOS transistor 20 is turned off so that the output from the first voltage level detector 14 is a low level signal. The output from the first voltage level detector 14 is input into the NAND gate 30 and the inverter 31 in order. As a result, the gate of the NMOS transistor 45 in the sense amplifier 10 receives the low level signal and the sense amplifier 10 is disabled.

Similarly, when the sensing output signal /SAout from the sense amplifier 10 is more than the reference voltage according to the continued sensing operation, the PMOS transistor 24 is turned off so that the output from the second voltage level detector 15 is a low level signal. The output from the second voltage level detector 15 is input into the NAND gate 30 and the inverter 31 in order. The gate of the NMOS transistor 45 in the sense amplifier 10 receives the low level signal and the sense amplifier 10 is disabled.

That is to say, one of the output SAout and /SAout from the sense amplifier 10 increases more than the reference voltage which is determined by the NMOS transistors 21 and 23 (or 25 and 27), the low level signal from the first or second voltage level detector 14 or 15 is input to the enable/disable part 13 so that the sense amplifier 10 is disabled.

As apparent from the stated above, the present invention has effects in that power consumption is minimized by disabling the sense amplifier when the sensing operation increases up to a predetermined voltage level, using the outputs from the sense amplifier, and in that an error in the sense amplifier is prevented from being generated by an excessive sensing operation.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device including a sense amplifier having a first output and a second output, comprising:

a first detecting means receiving only the first output from the sense amplifier, and detecting whether the first output reaches a first voltage level by inverting the first voltage level when the first output is at the first voltage level;

a second detecting means receiving only the second output from the sense amplifier, and detecting whether the second output reaches to a second voltage level by inverting the second voltage level when the second output is at the second voltage level; and a control means for enabling/disabling the sense amplifier in response to output signals from the first and second detecting means, whereby the sense amplifier is disabled when a voltage difference between the first output and the second output increases up to a predetermined voltage level.

2. The semiconductor device in accordance with claim 1, wherein the first detecting means comprises:

a PMOS transistor having a source coupled to a voltage source and a gate receiving the first output from the sense amplifier;

a first NMOS transistor having a drain couple to the drain of the PMOS transistor and a gate receiving the first output from the sense amplifier;

a second NMOS transistor having a drain coupled to the source of the first NMOS transistor, a gate receiving the first output from the sense amplifier and a source coupled to a ground level; and a third NMOS transistor having a drain coupled to said voltage source, a gate coupled to the drain of the first NMOS transistor and a source coupled to the source of the first NMOS transistor.

3. The semiconductor device in accordance with claim 1, wherein the second detecting means comprised:

a PMOS transistor having a source coupled to a voltage source and a gate receiving the second output from the sense amplifier;

a first NMOS transistor having a drain couple to the drain of the PMOS transistor and a gate receiving the second output from the sense amplifier;

a second NMOS transistor having a drain coupled to the source of the first NMOS transistor, a gate receiving the second output from the sense amplifier and a source coupled to a ground level; and a third NMOS transistor having a drain coupled to said voltage source, a gate coupled to the drain of the 1st NMOS transistor and a source coupled to the source of the 1st NMOS transistor.

4. The semiconductor device in accordance with claim 1, wherein the control means comprises:

a NANDing means receiving the outputs from the first and second detecting means; and an inverting means inverting the output from the NANDing means.

5. The semiconductor device in accordance with claim 2, wherein the first voltage level is determined by controlling the length and width of the first and third NMOS transistors.

6. The semiconductor device in accordance with claim 3, wherein the second voltage level is determined by controlling the length and width of the first and third NMOS transistors.

* * * * *